(12) United States Patent
Peterson et al.

(10) Patent No.: US 11,309,853 B1
(45) Date of Patent: Apr. 19, 2022

(54) COMMON MODE OUTPUT VOLTAGE BIASING IN CLASS-D AUDIO AMPLIFIERS HAVING SELECTABLE DIFFERENTIAL OR DUAL SINGLE-ENDED OPERATION

(71) Applicant: CIRRUS LOGIC INTERNATIONAL SEMICONDUCTOR, LTD., Edinburgh (GB)

(72) Inventors: Cory J. Peterson, Austin, TX (US); Chandra Prakash, Austin, TX (US); Ramin Zanbaghi, Austin, TX (US); Eric Kimball, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/161,815

(22) Filed: Jan. 29, 2021

(51) Int. Cl.
*H03F 3/217* (2006.01)
*H03F 3/185* (2006.01)
*H03F 1/02* (2006.01)
*H03F 3/45* (2006.01)

(52) U.S. Cl.
CPC ......... *H03F 3/2173* (2013.01); *H03F 1/0233* (2013.01); *H03F 2200/03* (2013.01)

(58) Field of Classification Search
CPC ... H03F 3/2173; H03F 1/0233; H03F 2200/03
USPC ....................................... 330/10, 207 A, 251
See application file for complete search history.

(56) References Cited

U.S. PATENT DOCUMENTS

| 7,053,806 B1 | 5/2006 | Rao et al. |
| 8,803,569 B1 | 8/2014 | Malladi et al. |
| 9,319,033 B1 | 4/2016 | Jin et al. |
| 10,734,981 B1 | 8/2020 | Zanbaghi |
| 2007/0229159 A1* | 10/2007 | Krishnan ................ H03F 3/217 330/253 |

OTHER PUBLICATIONS

U.S. Appl. No. 16/869,226, entitled Common-Mode Leakage Error Calibration for Current Sensing in a Class-D Stage Using a Pilot Tone, filed May 7, 2020.
U.S. Appl. No. 17/151,877, entitled Dual-Channel Class-D Audio Amplifier Having Quantizer-Combined Orthogonal Modulation, filed Jan. 19, 2021.

* cited by examiner

*Primary Examiner* — Hieu P Nguyen
(74) *Attorney, Agent, or Firm* — Mitch Harris, Atty at Law, LLC; Andrew M. Harris

(57) ABSTRACT

A class-D amplifier includes a first differential modulator circuit, a first driver circuit including a first high-side switch and a first low-side switch. An input of the first driver circuit may be coupled to a first output of the first differential modulator circuit so that the first differential modulator circuit controls the first driver circuit. The class-D amplifier may also include a second driver circuit including a second high-side switch and a second low-side switch coupling the second and control logic that selects between a single-ended operating state and a differential operating state of the class-D amplifier circuit. The control logic may selectively determine the input of the second driver circuit in conformity with a current operating state of the class-D amplifier circuit so that the first differential modulator circuit controls the second driver circuit when the differential operating state is selected.

22 Claims, 5 Drawing Sheets

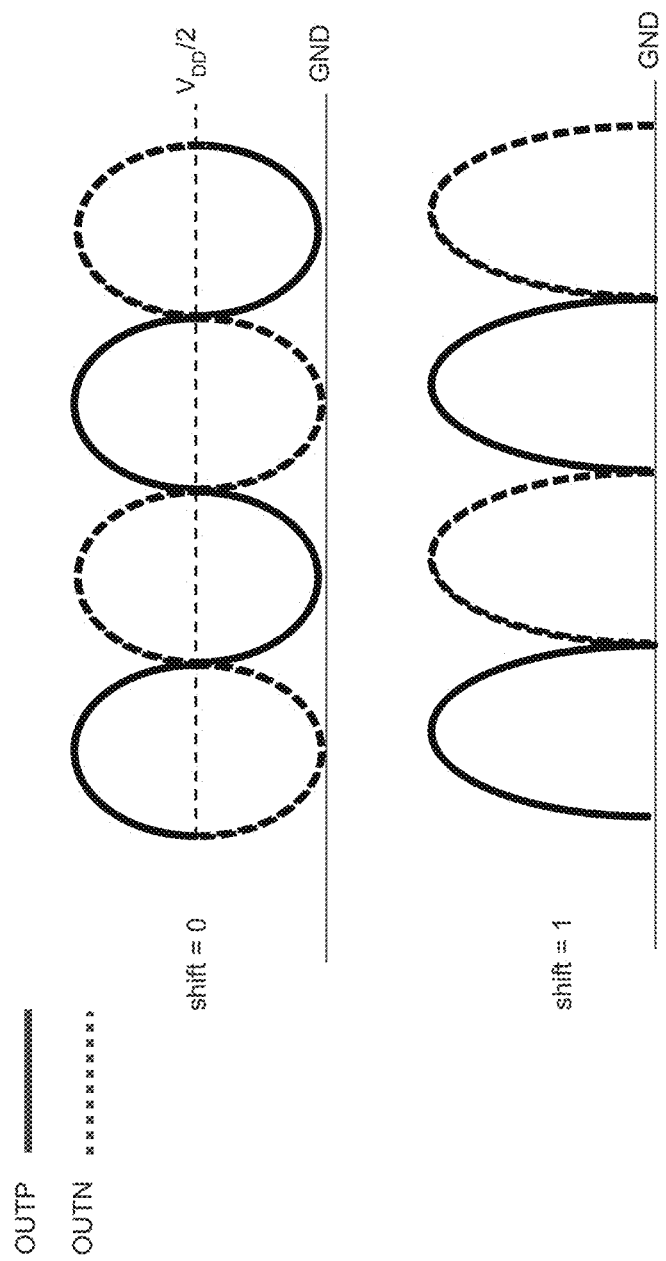

COMMON MODE OUTPUT VOLTAGE BIASING IN CLASS-D AUDIO AMPLIFIERS HAVING SELECTABLE DIFFERENTIAL OR DUAL SINGLE-ENDED OPERATION

BACKGROUND

1. Field of Disclosure

The field of representative embodiments of this disclosure relates to audio amplifier or haptic driver methods and circuits that are operable in a differential or dual single-ended configuration, and in which common-mode output voltage is biased via by post-modulator modification of the switching signals.

2. Background

Audio amplifiers, and other amplifiers such as those for driving haptic feedback devices, generally require multi-channel operation, e.g., stereo audio amplifiers. In some instances, such as when generating higher power level signals, it is desirable to be able to configure two channels in a bridge configuration, i.e., in a differential configuration. A differential configuration is easily operated from a single power supply voltage and its corresponding return node, as the bridge configuration of the two amplifier outputs permits both negative and positive signal excursions due to the differential operation of the two outputs.

However, when operating in the single-ended configuration, particularly in voice-coil type transducer applications, the current return terminal of the transducer must either be capacitively coupled to the power supply, or somehow supplied with a high current return circuit that is biased to minimize DC current through the transducer, in order to avoid wasting energy passing DC current through the transducer. An alternative is to bias the operation of the amplifier channels so that the AC signal midpoint, i.e., the common-mode voltage of the outputs is near a selected one of the power supply rails and to use the selected power supply rail as the return terminal. The disadvantage of such operation in a class-D amplifier is that the modulator control loop is also operated with a quiescent point near the selected power rail, which reduces the dynamic range of the amplifier, the signal-to-noise ratio (SNR) and signal-to-distortion ratio (SDR).

Therefore, it would be advantageous to operate a class-D amplifier with a quiescent point near one of the power supply rails without compromising dynamic range, SNR, SDR and other operating characteristics of the amplifier.

SUMMARY

Improved class-D amplifier configuration and operation is accomplished in Class-D amplifier circuits, integrated circuits including Class-D amplifiers and their methods of operation.

The class-D amplifier includes a first differential modulator circuit, a first driver circuit including a first high-side switch coupling the first output of the class-D amplifier to a positive power supply and a first low-side switch coupling the first output of the class-D amplifier to a negative power supply. An input of the first driver circuit is coupled to a first output of the first differential modulator circuit so that the first differential modulator circuit controls the first driver circuit. The class-D amplifier also includes a second driver circuit including a second high-side switch coupling a second output of the class-D amplifier to a positive power supply and a second low-side switch coupling the second output of the class-D amplifier to a negative power supply and control logic that selects between a single-ended operating state and a differential operating state of the class-D amplifier circuit. The control logic has a first input coupled to a second output of the first differential modulator circuit, and an input of the second driver circuit is coupled to an output of the control logic block. The control logic may selectively determine the input of the second driver circuit in conformity with a current operating state of the class-D amplifier circuit.

In some embodiments, the Class-D amplifier includes a second differential modulator circuit having an output coupled to a second input of the control logic, and the control logic, in response to selection of the single-ended operating state as the current operating state of the class-D amplifier circuit, may determine the input of the second driver circuit from the output of the second differential modulator circuit, and responsive to selection of the differential operating state as the current operating state of the class-D amplifier circuit, may determine the input of the second driver circuit from the second output of the first differential modulator circuit. In some embodiments, the control logic may couple the output of the first differential modulator to the input of the first driver circuit and modify the first output of the first differential modulator circuit to shift an average voltage of the first driver circuit when the single-ended operating state is selected as the current operating state of the class-D amplifier circuit. In some embodiments, the first single-ended driver may further include a first feedback driver circuit including a third high-side switch coupling a first feedback node to a positive power supply and third low-side switch coupling the first feedback node to a negative power supply. The control logic may further couple an input of the first feedback driver circuit to a second output of the first differential modulator circuit, and the control logic may shift the average voltage at the output of the first driver circuit to a value near a voltage of the negative power supply or a voltage of the positive power supply. In some embodiments, the control logic may modify the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver may both be forced to given one of a positive state or a negative state, so that the first driver circuit and the first feedback driver may only assume different states or the given positive or negative state.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 5 is an example signal waveform diagram illustrating operation of example amplifier channel 20 of FIG. 2, in accordance with an embodiment of the disclosure.

DETAILED DESCRIPTION OF ILLUSTRATIVE EMBODIMENT

The present disclosure encompasses circuits and integrated circuits that include improved Class-D amplifier circuits and their method of operation. The class-D amplifier includes a first differential modulator circuit, a first driver circuit including a first high-side switch coupling the first output of the class-D amplifier to a positive power supply and a first low-side switch coupling the first output of the class-D amplifier to a negative power supply. An input of the first driver circuit is coupled to a first output of the first differential modulator circuit so that the first differential modulator circuit controls the first driver circuit. The class-D amplifier also includes a second driver circuit including a second high-side switch coupling a second output of the class-D amplifier to a positive power supply and a second low-side switch coupling the second output of the class-D amplifier to a negative power supply and control logic that selects between a single-ended operating state and a differential operating state of the class-D amplifier circuit. The control logic has a first input coupled to a second output of the first differential modulator circuit, and an input of the second driver circuit is coupled to an output of the control logic block. The control logic may selectively determine the input of the second driver circuit in conformity with a current operating state of the class-D amplifier circuit.

Figure 1A:
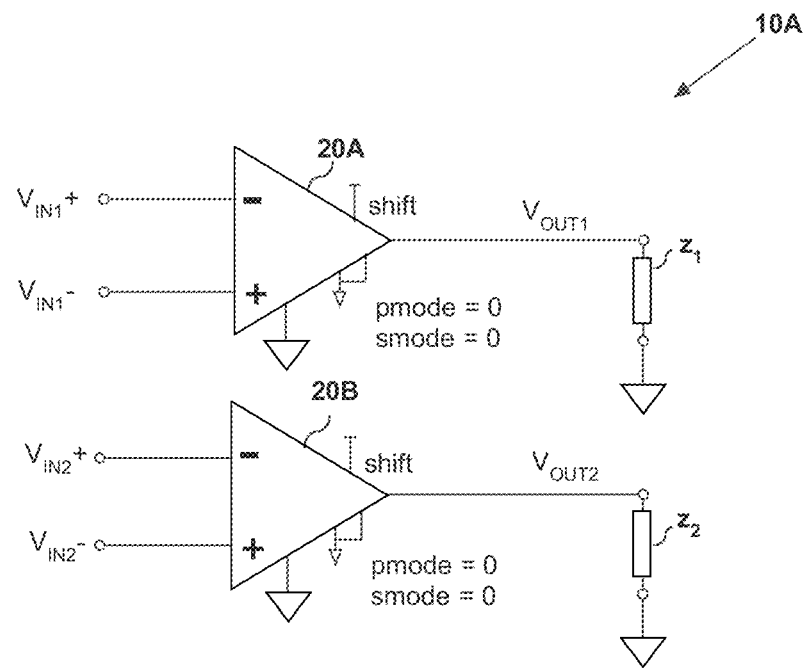
FIG. 1A is a circuit diagram showing multiple example amplifier channels operated in a single ended configuration 10A and FIG. 1B is a circuit diagram showing the multiple amplifiers 20A, 20B operated in a differential configuration 10B, in accordance with an embodiment of the disclosure.
Figure 1B:
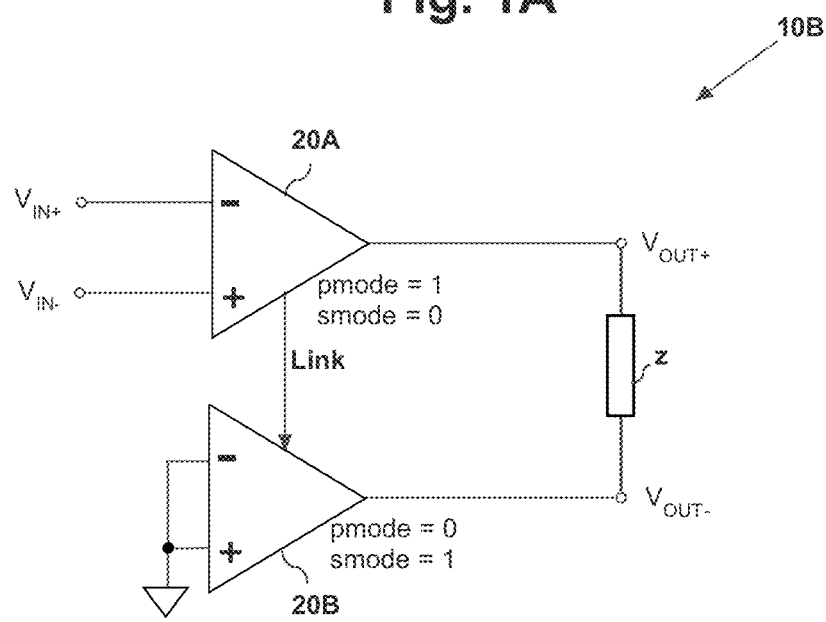

Referring now to FIG. 1A, an example of multiple example amplifier channels operated in a single ended configuration 10A. Two selection inputs are provided at each of amplifier 20A and amplifier 20B and select between a single-ended dual channel operating state or a differential operating state as shown in FIG. 1B. If selection input pmode and input smode are both set to a logical-zero value, Amplifier 20A reproduces a signal representative of a differential input signal pair $V_{IN1+}$, $V_{IN1-}$ at output $V_{OUT1}$ to drive load $z_1$, and Amplifier 20B reproduces a signal representative of a differential input signal pair $V_{IN2+}$, $V_{IN2-}$ at output $V_{OUT2}$. If selection input pmode is set to a logical-1 value on a first one of the amplifiers, e.g., amplifier 20A in FIG. 1B, and selection input smode is set to a logical-1 value on the second one of the amplifiers, e.g., amplifier 20B as shown in FIG. 1B, then amplifier 20A becomes a primary amplifier that controls amplifier 20B, which becomes a secondary amplifier. A Link signal provides an analog of a difference of between a pair of differential input signals $V_{IN+}$ and $V_{IN-}$ to amplifier 20B, which provides an inverted version of output $V_{OUT+}$ of amplifier 20A at output $V_{OUT-}$, resulting in a differential drive signal across a load z.

Figure 2:
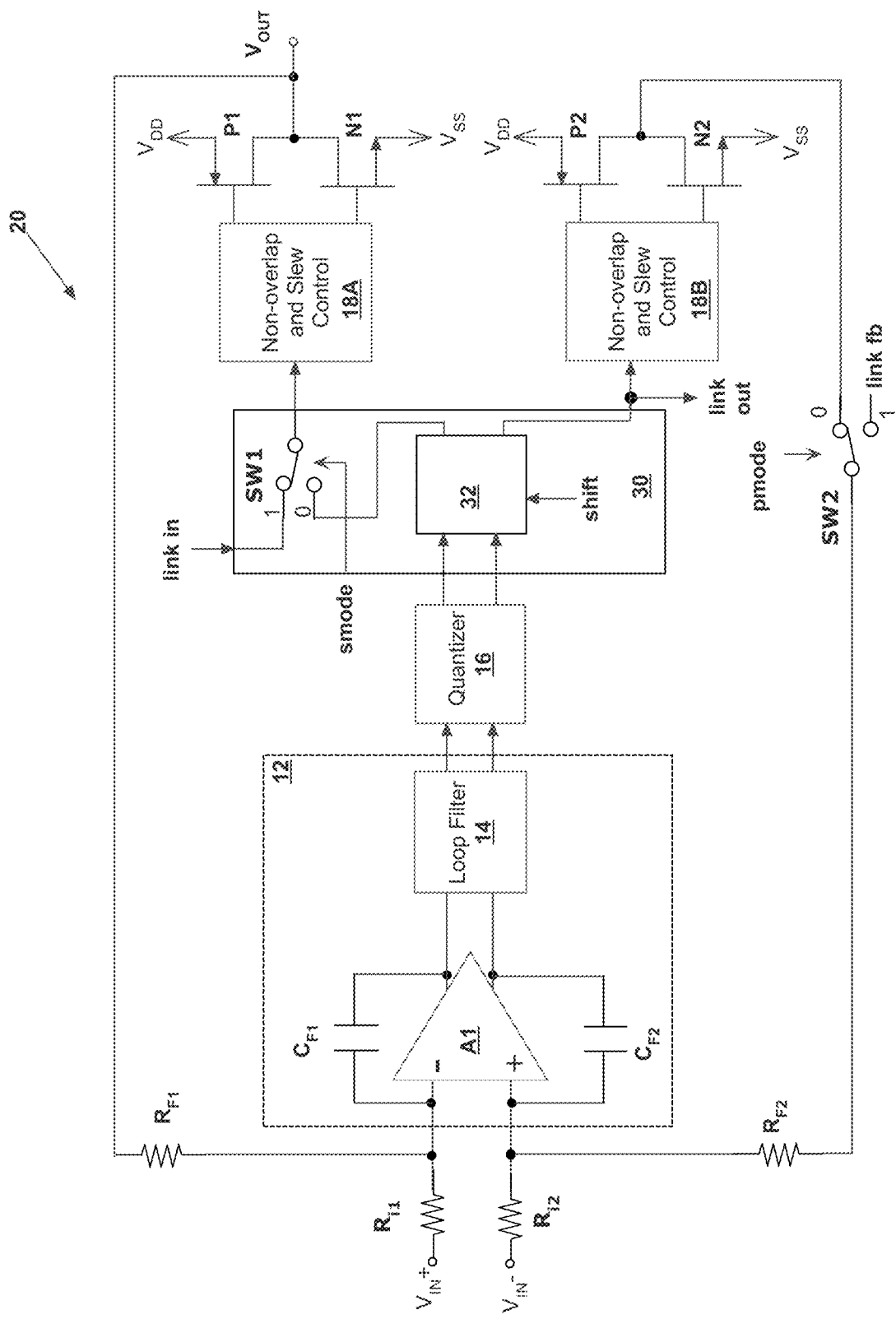
FIG. 2 is a simplified schematic diagram of an example amplifier channel 20 that may be used to implement amplifiers 20A, 20B of FIG. 1A and FIG. 1B, in accordance with an embodiment of the disclosure.

Referring now to FIG. 2, a simplified schematic diagram of an example amplifier channel 20 that may be used to implement amplifiers 20A, 20B of FIG. 1A and FIG. 1B is shown, in accordance with an embodiment of the disclosure. A fully-differential integrator 12 provided by amplifier A1, feedback capacitors $C_{F1}$, $C_{F2}$ and input resistors $R_{i1}$, $R_{i2}$ provides an input signal to a loop filter 14 that is also fully-differential. The differential output of loop filter 14 is provided to a quantizer 16, having a differential pulse-width modulated (PWM) output that is provided to a control logic block 30. A pair of outputs of control logic block are provided to inputs of corresponding non-overlap and skew control blocks 18A, 18B that are formed by analog or analog/digital hybrid networks. Non-overlap and skew control blocks 18A, 18B condition the risetimes of the outputs of control logic block 30 and prevent switching overlap between a pair of outputs of each of non-overlap and skew control blocks 18A, 18B that drive corresponding high-side switching transistors P1, P2 and corresponding low-side switching transistors N1, N2. An output signal of amplifier 20 is provided from the output driver formed by high-side switching transistor P1 and low-side switching transistor N1. A feedback driver circuit is provided by high-side switching transistor P2 and low-side switching transistor N2, which provides for a fully-differential feedback via feedback resistor $R_{F2}$, which along with feedback resistor $R_{F1}$, provide closed-loop sigma-delta operation of integrator 12 and quantizer 16.

When a pair of amplifiers 20 are operated in differential mode as exemplified in FIG. 1B, switch S1 in control logic block 30, which receives a signal from another amplifier's control loop at input link in, directs that signal to the input of non-overlap and skew control block 18A. The selection occurs when amplifier 20 is selected as the secondary amplifier when selection input smode is asserted as described above. Otherwise, the input of non-overlap and skew control block 18A is provided by the non-inverting output of quantizer 16, which is provided from a pulse-state blocking control block 32, details of which are described below. Since signal link out is provided from the inverting output of quantizer 16, the signal received at input link in of the secondary amplifier is complementary to the signal link out provided to the input of non-overlap and skew control 18A of the primary amplifier, fully differential operation occurs using the modulator in the primary amplifier as the modulating source for both amplifiers. The feedback path from the feedback driver circuit provided by high-side switching transistor P2 and low-side switching transistor N2 is provided from an input link fb when amplifier 20 is selected as the primary amplifier, i.e., when selection input pmode is asserted to activate switch S2 to apply input link fb to feedback resistor $R_{F2}$. Input link fb is received from the output of the secondary amplifier, which in the example is amplifier 20B. The resulting operation of a pair of amplifiers 20, when the above-described selections and connections are made, is that the output driver circuit of both the primary and the secondary amplifier are operated with the complementary outputs of quantizer 16 of the primary amplifier, providing true differential operation. The feedback drivers in both amplifiers may be either operated or disabled, as their outputs are no longer used to supply feedback to the integrator in the primary amplifier, which generates all of the control of the pulse-width of the outputs of both amplifiers. The integrator and loop filter in the secondary amplifier may also be disabled to conserve power.

In a single-ended operating state as shown in FIG. 1A, since the return path of current from output $V_{OUT}$ is $V_{SS}$, which is ground in the example of FIG. 1A, in order to operate amplifier 20 without drawing excessive current from amplifier 20 through the connected load, the DC operating point of output $V_{OUT}$ is ideally very near ground, e.g., less than 1 Volt for a 5 Volt power supply, which would generally require that the quiescent operating point of quantizer 16 be close to 80% duty cycle, dramatically reducing the available dynamic range in the positive swing direction. Alternatively, the load could be connected to the positive power supply rail, but that would require the quiescent operating point of quantizer 16 to be near 20% duty cycle. A pulse-state blocking logic block 32 within control logic alters the output of quantizer 16 in order to shift the operating point of quantizer 16 to be near a midpoint (50% duty cycle), which maximizes the available dynamic range and improves SNR and DNR performance. While the example given above is with reference to PWM Class-D amplifiers, the instant disclosure encompasses other modulation techniques such as constant-edge modulation (CEM) and pulse-density modulation (PDM), which also operate with an effective duty-cycle that is comparable to PWM when viewed over a number of cycles.

In the instant example, the shift in quiescent operating point is accomplished when control input shift provided to control logic 30 is asserted, which activates pulse-state blocking logic block 32. Pulse-state blocking logic block 32 modifies the outputs quantizer 16 that is provided to non-overlap and skew control blocks 18A, 18B, by preventing the switching state of the output driver formed by high-side switching transistor P1 and low-side switching transistor N1 and the feedback driver circuit provided by high-side switching transistor P2 and low-side switching transistor N2, from assuming a state in which both high-side drivers are active, i.e., switching transistor P1 and switching transistor P2 are both on. The result is a shift in the quiescent value of output $V_{OUT}$ to a voltage near ground. For implementations in which the load is connected between output $V_{OUT}$ and power supply rail $V_{DD}$, pulse-state blocking logic block 32 blocks the state in which both switching transistor N1 and switching transistor N2 would otherwise be on. Control input shift may be asserted or left de-asserted when the differential operating state is selected, as long as the control logic implementing pulse-state blocking logic block 32 is the same for both amplifiers, as operation in a differential operating state does not require otherwise forcing quantizer 16 to operate near one of the power supply rails $V_{DD}$ or $V_{SS}$.

Figure 3A:
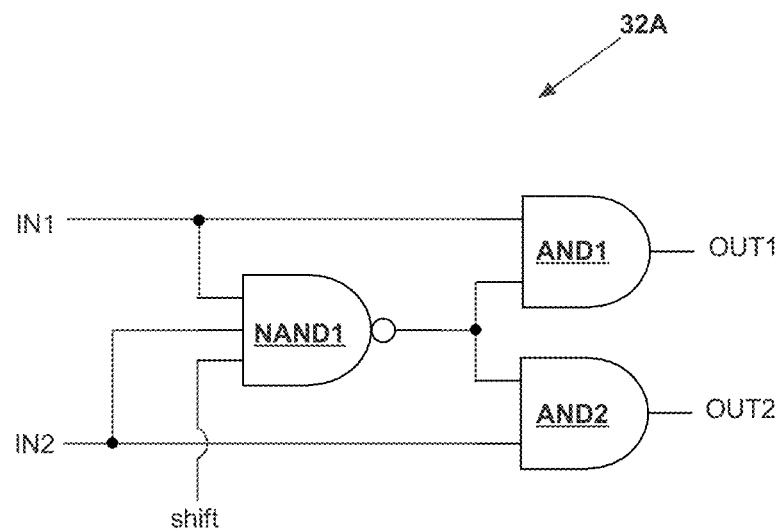
FIG. 3A is a schematic diagram showing an example of a pulse-state suppression logic circuit 32A that may be used to implement pulse-state suppression logic block 32 of FIG. 2, in accordance with an embodiment of the disclosure.

Referring now to FIG. 3A, a schematic diagram showing an example of a pulse-state suppression logic circuit 32A that may be used to implement pulse-state suppression logic block 32 of FIG. 2 is shown, in accordance with an embodiment of the disclosure. The outputs of quantizer 16 are provided to inputs IN1 and IN2 of pulse-state suppression logic block 32A. When control signal shift is de-asserted, the output of a logical-NAND gate NAND1 is held in the logical 1 state, enabling input IN1 onto output OUT1 of logical-AND gate AND1 and input IN2 onto output OUT2 of logical-AND gate AND2, which, other than any logic delay, is as if the outputs of quantizer 16 were connected directly to the corresponding inputs of non-overlap and skew control blocks 18A, 18B. When control input shift is asserted, and when both inputs IN1 and IN2 are in the logical 1 state, the output of logical-NAND gate NAND1 assumes the logical 0 state, and output OUT1 of logical-AND gate AND1 and the output of logical-AND gate AND2 are set to the logical-0 state, blocking the activation of both high-side switching transistors P1 and P2, assuming that non-overlap and skew control blocks 18A, 18B act as inverters, i.e., the sense of an output of quantizer 16 and the output of the corresponding output driver circuit are the same.

Figure 3B:
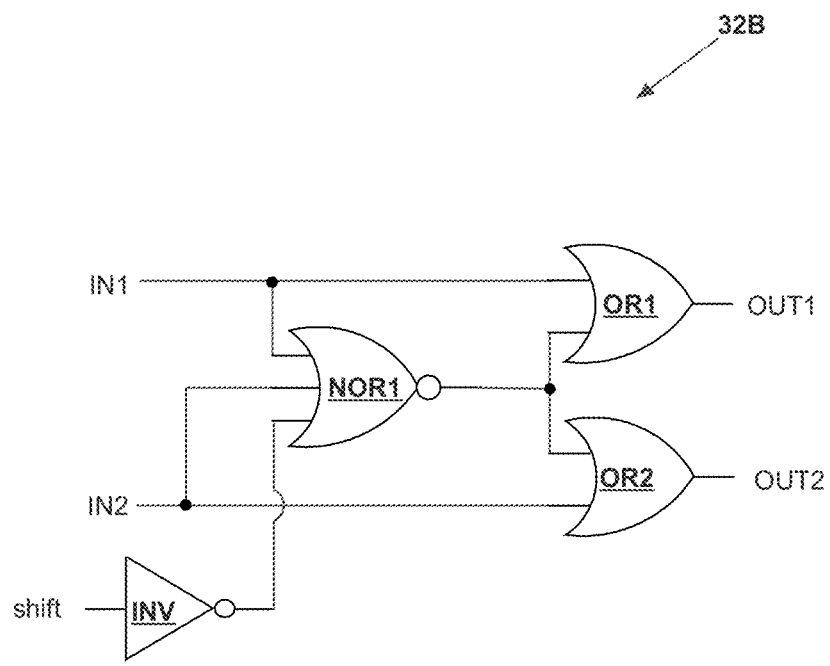
FIG. 3B is a schematic diagram showing an alternative example of a pulse-state suppression logic circuit 32B that may be used to implement pulse-state suppression logic block 32 of FIG. 2, in accordance with another embodiment of the disclosure.

Referring now to FIG. 3B, a schematic diagram showing an alternative example of a pulse-state suppression logic circuit 32B that may be used to implement pulse-state suppression logic block 32 of FIG. 2, in accordance with another embodiment of the disclosure. The depicted embodiment blocks the state in which low-side switching transistors N1 and N2 are turned on, in accordance with the alternative example described above. The outputs of quantizer 16 are provided to inputs IN1 and IN2 of pulse-state suppression logic block 32B. When control signal shift is de-asserted, thereby asserting the output of an inverter INV, the output of a logical-NOR gate NOR1 is held in the logical 0 state, enabling input IN1 onto output OUT1' of a logical-OR gate OR1 and input IN2 onto output OUT2' of a logical-OR gate OR2, which, other than any logic delay, is as if the outputs of quantizer 16 were connected directly to the corresponding inputs of non-overlap and skew control blocks 18A, 18B. When control input shift is asserted, and when both inputs IN1 and IN2 are in the logical 0 state, the output of logical-NOR gate NOR1 assumes the logical 1 state, and output OUT1' of logical-OR gate OR1 and the output of logical-OR gate OR2 are set to the logical-1 state, blocking the activation of both low-side switching transistors N1 and N2, assuming that non-overlap and skew control blocks 18A, 18B act as inverters, i.e., the sense of an output of quantizer 16 and the output of the corresponding output driver circuit are the same.

Figure 4:
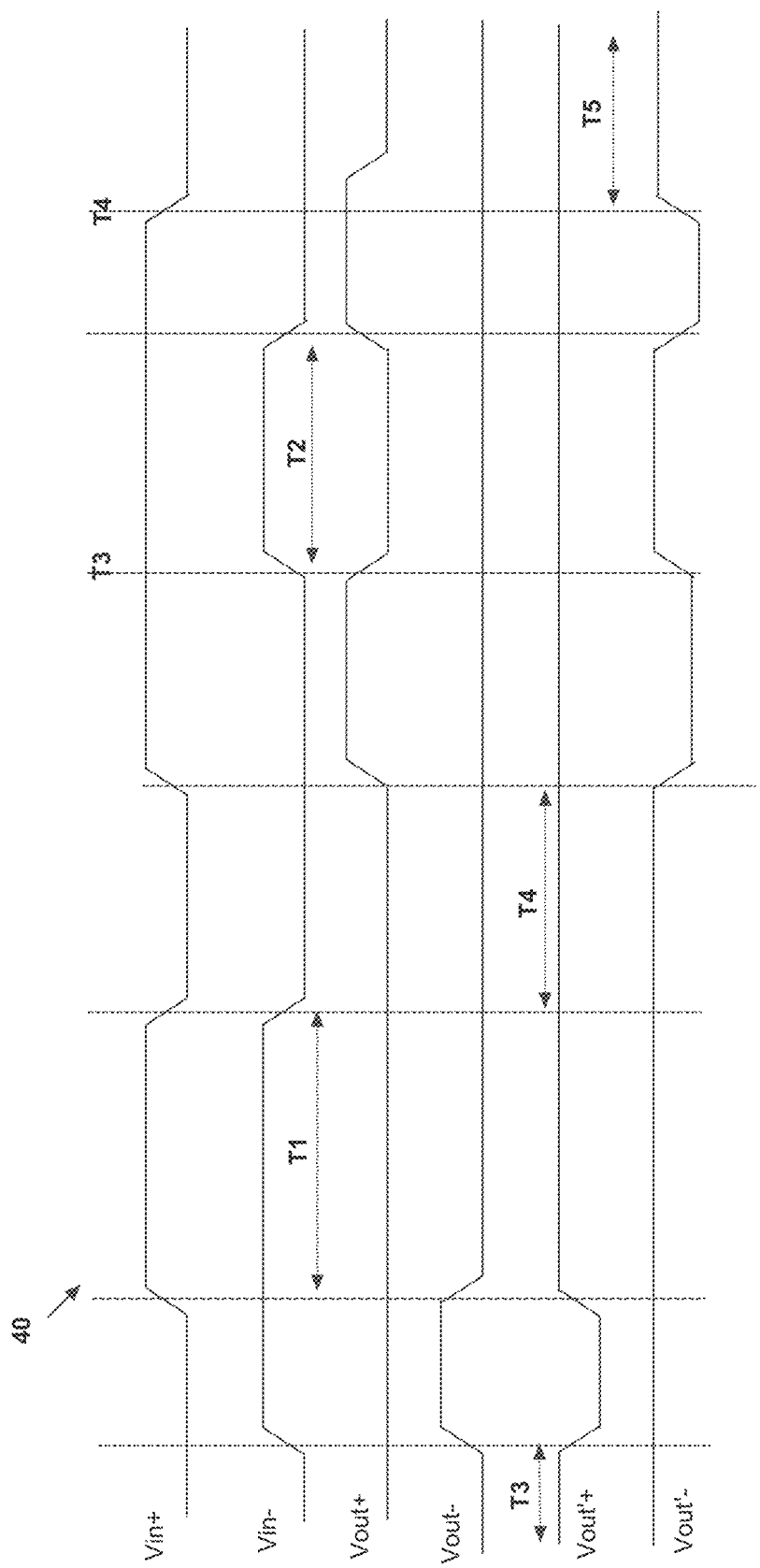
FIG. 4 is an example signal waveform diagram 40 illustrating operation of example pulse-state suppression logic 32A of FIG. 3A and example pulse-state suppression logic 32B of FIG. 3B, in accordance with another embodiment of the disclosure.

Referring now to FIG. 4, an example signal waveform diagram 40 illustrating operation of example pulse-state suppression logic 32A of FIG. 3A and example pulse-state suppression logic 32B of FIG. 3B is shown, in accordance with another embodiment of the disclosure. Signals Vin+ and Vin− correspond in polarity to the inputs IN1, IN2 of pulse-state suppression logic 32A and 32B. Signals Vout+ and Vout− are the output driver signal states for an amplifier 20 that blocks simultaneous assertion of two high-side pulses, e.g., an amplifier 20 that incorporates pulse-state suppression logic 32A. Signals Vout+ and Vout-, track their respective input signals Vin+ and Vin− except during time intervals T2 and T4, in which a "00" state is produced instead of state "11". Similarly, signals Vout'+ and Vout'− are the output driver signal states for an amplifier 20 that blocks simultaneous assertion of two low-side pulses, e.g., an amplifier 20 that incorporates pulse-state suppression logic 32B. Signals Vout'+ and Vout'−, track their respective input signals Vin+ and Vin− except during time intervals T1, T3 and T4, in which a "11" state is produced instead of state "00".

Referring now to FIG. 5 is an example signal waveform diagram illustrating operation of example amplifier channel 20 of FIG. 2, in accordance with an embodiment of the disclosure. The dashed portions of the waveforms (OUTN) correspond to the feedback driver output, and thus are not produced externally. The solid portions of the waveforms (OUTP) correspond to the amplifier driver output $V_{OUT}$, i.e., the output of amplifier 20. When control signal shift is de-asserted as illustrated in the top of FIG. 5, which is also representative of an amplifier that does not contain pulse-state blocking logic block 32, the average value of the output, i.e., the common-mode value of the output is $V_{DD}/2$, which, as described above, will waste excessive power and send a relatively large amount of current through a voice-coil type load. The bottom portion of FIG. 5 illustrates the output of amplifier 20 when control signal shift is asserted, in which the average value is much lower, e.g., $V_{DD}/5$, which for an amplifier 20 operated from a 5 Volt power supply is a change from 2.5V to 0.5V in output offset. At a minimum, the average output voltage is half that of the upper portion of the Figure, since the output of amplifier 20 is active only half of the time.

In summary, this disclosure shows and describes circuits and integrated circuits having Class-D amplifiers that include a first differential modulator circuit, a first driver circuit including a first high-side switch coupling the first output of the class-D amplifier to a positive power supply and a first low-side switch coupling the first output of the class-D amplifier to a negative power supply. An input of the first driver circuit is coupled to a first output of the first differential modulator circuit so that the first differential modulator circuit controls the first driver circuit. The class-D amplifier also includes a second driver circuit including a second high-side switch coupling a second output of the class-D amplifier to a positive power supply and a second low-side switch coupling the second output of the class-D amplifier to a negative power supply, and control logic that selects between a single-ended operating state and a differential operating state of the class-D amplifier circuit. The control logic has a first input coupled to a second output of the first differential modulator circuit, and an input of the second driver circuit is coupled to an output of the control logic block. The control logic may selectively determine the input of the second driver circuit in conformity with a current operating state of the class-D amplifier circuit.

In some example embodiments, the Class-D amplifier includes a second differential modulator circuit having an output coupled to a second input of the control logic, and the control logic, in response to selection of the single-ended operating state as the current operating state of the class-D amplifier circuit, determines the input of the second driver circuit from the output of the second differential modulator circuit, and responsive to selection of the differential operating state as the current operating state of the class-D amplifier circuit, determines the input of the second driver circuit from the second output of the first differential modulator circuit. In some embodiments, the control logic couples the output of the first differential modulator to the input of the first driver circuit and modifies the first output of the first differential modulator circuit to shift a common-mode voltage of the first driver circuit. In some embodiments, the first single-ended driver further includes a first feedback driver circuit including a third high-side switch coupling a first feedback node to a positive power supply and third low-side switch coupling the first feedback node to a negative power supply, and the control logic further couples an input of the first feedback driver circuit to a second output of the first differential modulator circuit, and the control logic shifts an average voltage at the output of the first driver circuit to a value near a voltage of the negative power supply or a voltage of the positive power supply. In some embodiments, the control logic modifies the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver are both forced to a given one of a positive state or a negative state, so that the first driver circuit and the first feedback driver may only assume different states or the given positive or negative state.

In some example embodiments, the class-D amplifier circuit may include second control logic that modifies the first output of the second differential modulator circuit to control a common-mode voltage of the second single-ended driver when the single-ended operating state is selected as the current operating state of the class-D amplifier circuit. The second single-ended driver may further include a second feedback driver circuit including a fourth high-side switch coupling a second feedback node to a positive power supply and fourth low-side switch coupling the second feedback node to a negative power supply, and the second control logic may couple an input of the second feedback driver circuit to a second output of the second differential modulator circuit. The control logic may shift an average voltage at the output of the second driver circuit to the value near the voltage of the negative power supply or the voltage of the positive power supply. The second control logic may modify the first output of the second differential modulator circuit and the second output of the second differential modulator circuit, so that when the first output of the second differential modulator circuit and the second output of the second differential modulator circuit are equal, the first output of the second differential modulator circuit as provided to the second driver circuit and the second output of the second differential modulator circuit as provided to the second feedback driver are both forced to a second given one of a positive state or a negative state, so that the second driver circuit and the second feedback driver may only assume different states or the second given positive or negative state.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an IC having a switched-capacitor delta-sigma data converter with an internal filter capacitor.

What is claimed is:

1. A class-D amplifier circuit, comprising:
   a first differential modulator circuit;
   a first driver circuit including a first high-side switch coupling the first output of the class-D amplifier to a positive power supply and a first low-side switch coupling the first output of the class-D amplifier to a negative power supply, wherein an input of the first driver circuit is coupled to a first output of the first differential modulator circuit so that the first differential modulator circuit controls the first driver circuit;
   a second driver circuit including a second high-side switch coupling a second output of the class-D amplifier to the positive power supply and a second low-side switch coupling the second output of the class-D amplifier to the negative power supply; and
   control logic that selects between a single-ended operating state and a differential operating state of the class-D amplifier circuit and having a first input coupled to a second output of the first differential modulator circuit, wherein an input of the second driver circuit is coupled to an output of the control logic block, wherein the control logic selectively determines the input of the second driver circuit in conformity with a current operating state of the class-D amplifier circuit.

2. The class-D amplifier circuit of claim 1, further comprising a second differential modulator circuit having an output coupled to a second input of the control logic, and wherein the control logic, responsive to selection of the single-ended operating state as the current operating state of the class-D amplifier circuit, determines the input of the second driver circuit from the output of the second differential modulator circuit, and responsive to selection of the differential operating state as the current operating state of the class-D amplifier circuit, determines the input of the second driver circuit from the second output of the first differential modulator circuit.

3. The class-D amplifier circuit of claim 2, wherein the control logic couples the output of the first differential modulator to the input of the first driver circuit and modifies the first output of the first differential modulator circuit to shift an average voltage at the output of the first driver circuit.

4. The class-D amplifier circuit of claim 3, wherein the first driver circuit further comprises a first feedback driver circuit including a third high-side switch coupling a first feedback node to the positive power supply and third low-side switch coupling the first feedback node to the negative power supply, and wherein the control logic further couples an input of the first feedback driver circuit to a second output of the first differential modulator circuit, and wherein the control logic shifts the average voltage at the output of the first driver circuit to a value near a voltage of the negative power supply or a voltage of the positive power supply when the class-D amplifier circuit is operated in the single-ended mode.

5. The class-D amplifier circuit of claim 4, wherein the control logic modifies the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver are both forced to given one of a positive state or a negative state, so that the first driver circuit and the first feedback driver only assume different states or the given positive or negative state.

6. The class-D amplifier circuit of claim 5, wherein the given one of the two states in which the pair of signals are equal values is the negative state.

7. The class-D amplifier circuit of claim 5, further comprising second control logic that modifies the first output of the second differential modulator circuit to shift an average voltage at the output of the second driver circuit, wherein the second driver circuit further comprises a second feedback driver circuit including a fourth high-side switch coupling a second feedback node to the positive power supply and fourth low-side switch coupling the second feedback node to the negative power supply, wherein the second control logic couples an input of the second feedback driver circuit to a second output of the second differential modulator circuit, and wherein the second control logic shifts the average voltage at the output of the second driver circuit to the value near the voltage of the negative power supply or the voltage of the positive power supply when the class-D amplifier circuit is operated in the single-ended mode, and wherein the second control logic modifies the first output of the second differential modulator circuit and the second output of the second differential modulator circuit so that when the first output of the second differential modulator circuit and the second output of the second differential modulator circuit are equal, the first output of the second differential modulator circuit as provided to the second driver circuit and the second output of the second differential modulator circuit as provided to the second feedback driver are both forced to a second given one of a positive state or a negative state, so that the second driver circuit and the second feedback driver only assume different states or the second given positive or negative state.

8. A class-D amplifier circuit, comprising:
    a first differential modulator circuit receiving first feedback from an output of the class-D amplifier circuit, the first feedback including a direct current (DC) component;
    a control logic block having an input coupled to an output of the first differential modulator circuit; and
    a first driver circuit including a first high-side switch coupling an output of the class-D amplifier to a positive power supply and a first low-side switch coupling the output of the class-D amplifier to a negative power supply, wherein an input of the first driver circuit is coupled to an output of the control logic block, and wherein the control logic block modifies the output of the first differential modulator circuit so that an average voltage at the output of the first driver circuit is shifted to a value near a voltage of the negative power supply or a voltage of the positive power supply and provides the modified output of the first differential modulator to the input of the first driver circuit.

9. The class-D amplifier circuit of claim 8, wherein the first single-ended driver further comprises a feedback driver circuit including a second high-side switch coupling a first feedback node to the positive power supply and second low-side switch coupling the first feedback node to the negative power supply, and wherein the control logic further couples an input of the feedback driver circuit to an output of the first differential modulator circuit, and wherein the control logic shifts the average voltage at the output of the first driver circuit at the value near the voltage of the negative power supply or the voltage of the positive power supply when the class-D amplifier circuit is operated in the single-ended mode.

10. The class-D amplifier circuit of claim 9, wherein the control logic modifies the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the feedback driver are both forced to a given one of a positive state or a negative state, so that the first driver circuit and the feedback driver only assume different states or the given positive or negative state.

11. The class-D amplifier circuit of claim 10, wherein the given one of the two states in which the pair of signals are equal values is the negative state.

12. A method of operating a class-D amplifier circuit, comprising:
    generating a first drive signal from a differential input signal with a first differential modulator circuit;
    producing a first power output signal of the class-D amplifier circuit from a first driver circuit including a first high-side switch coupling the first output of the class-D amplifier to a positive power supply and a first low-side switch coupling the first output of the class-D amplifier to a negative power supply in response to a first output of the first differential modulator circuit so that the first differential modulator circuit controls the first driver circuit;

producing a second power output signal of the class-D amplifier circuit from a second driver circuit including a second high-side switch coupling a second output of the class-D amplifier to the positive power supply and a second low-side switch coupling the second output of the class-D amplifier to the negative power supply;

selecting between a single-ended operating state and a differential operating state of the class-D amplifier circuit by control logic having a first input coupled to a second output of the first differential modulator circuit, wherein an input of the second driver circuit is coupled to an output of the control logic block; and selectively determining the input of the second driver circuit in conformity with a current operating state of the class-D amplifier circuit.

13. The method of claim 12, further comprising:
generating a second drive signal with a second differential modulator circuit;
responsive to selection of the single-ended operating state as the current operating state of the class-D amplifier circuit, determining the input of the second driver circuit from the output of the second differential modulator circuit; and
responsive to selection of the differential operating state as the current operating state of the class-D amplifier circuit, determining the input of the second driver circuit from the second output of the first differential modulator circuit.

14. The method of claim 13, further comprising coupling the output of the first differential modulator to the input of the first driver circuit and modifying the first output of the first differential modulator circuit to shift an average voltage at the output of the first driver circuit.

15. The method of claim 14, wherein the first driver circuit further comprises a first feedback driver circuit including a third high-side switch coupling a first feedback node to the positive power supply and third low-side switch coupling the first feedback node to the negative power supply, and wherein the method further comprises:
coupling an input of the first feedback driver circuit to a second output of the first differential modulator circuit; and
shifting an average voltage at the output of the first driver circuit to a value near a voltage of the negative power supply or a voltage of the positive power supply when the class-D amplifier circuit is operated in the single-ended mode.

16. The method of claim 15, further comprising modifying the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver are both forced to a given one of a positive state or a negative state, so that the first driver circuit and the first feedback driver only assume different states or the given positive or negative state.

17. The method of claim 16, wherein the given one of the two states in which the pair of signals are equal values is the negative state.

18. The method of claim 17, further comprising:
modifying the first output of the second differential modulator circuit to shift an average voltage at the output of the second single-ended driver circuit, wherein the second single-ended driver circuit further comprises a second feedback driver circuit including a fourth high-side switch coupling a second feedback node to the positive power supply and fourth low-side switch coupling the second feedback node to the negative power supply;
coupling an input of the second feedback driver circuit to a second output of the second differential modulator circuit;
shifting an average voltage at the output of the second driver circuit to the value near the voltage of the negative power supply or the voltage of the positive power supply when the class-D amplifier circuit is operated in the single-ended mode; and
modifying the first output of the second differential modulator circuit and the second output of the second differential modulator circuit so that when the first output of the second differential modulator circuit and the second output of the second differential modulator circuit are equal, the first output of the second differential modulator circuit as provided to the second driver circuit and the second output of the second differential modulator circuit as provided to the second feedback driver are both forced to a second given one of a positive state or a negative state, so that the second driver circuit and the second feedback driver only assume different states or the second given positive or negative state.

19. A method of operating a class-D amplifier circuit, comprising:
receiving first feedback from an output of the class-D amplifier circuit with a first differential modulator circuit, the first feedback including a direct current (DC) component;
producing a first power output signal of the class-D amplifier circuit from an output of the first differential modulator with a first driver circuit including a first high-side switch coupling an output of the class-D amplifier to a positive power supply and a first low-side switch coupling the output of the class-D amplifier to a negative power supply;
modifying the output of the first differential modulator circuit so that an average voltage at the output of the first driver circuit is shifted to a value near a voltage of the negative power supply or a voltage of the positive power supply.

20. The method of claim 19, wherein the first single-ended driver further comprises a first feedback driver circuit including a third high-side switch coupling a first feedback node to the positive power supply and third low-side switch coupling the first feedback node to the negative power supply, and wherein the method further comprises:
coupling an input of the first feedback driver circuit to a second output of the first differential modulator circuit; and
shifting an average voltage at the output of the first driver circuit at the value near the voltage of the negative power supply or the voltage of the positive power supply when the class-D amplifier circuit is operated in the single-ended mode.

21. The method of claim 20, further comprising modifying the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver are both forced to a given one of a positive state or a negative state, so that the first driver circuit and the first feedback driver only assume different states or the given positive or negative state.

22. The method of claim 21, wherein the given one of the two states in which the pair of signals are equal values is the negative state.

* * * * *

UNITED STATES PATENT AND TRADEMARK OFFICE
CERTIFICATE OF CORRECTION

PATENT NO. : 11,309,853 B1
APPLICATION NO. : 17/161815
DATED : April 19, 2022
INVENTOR(S) : Peterson et al.

Page 1 of 1

It is certified that error appears in the above-identified patent and that said Letters Patent is hereby corrected as shown below:

In the Specification

Column 1, Line 14, delete "via by" and insert -- via --, therefor.

Column 4, Line 4, delete "difference of" and insert -- difference --, therefor.

Signed and Sealed this
Twenty-first Day of June, 2022

Katherine Kelly Vidal
*Director of the United States Patent and Trademark Office*